United States Patent
Pfahl et al.

(10) Patent No.: US 11,410,950 B2
(45) Date of Patent: Aug. 9, 2022

(54) SEMICONDUCTOR SUBSTRATE HAVING A BOND PAD MATERIAL BASED ON ALUMINUM

(71) Applicant: Infineon Technologies AG, Neubiberg (DE)

(72) Inventors: Gert Pfahl, Munich (DE); Daniel Bolowski, Moehnsee (DE); Marian Sebastian Broll, Soest (DE); Michael Kreuz, Schwerte (DE); Evelyn Napetschnig, Diex (AT); Holger Schulze, Villach (AT); Stefan Woehlert, Villach (AT)

(73) Assignee: Infineon Technologies AG, Neubiberg (DE)

( * ) Notice: Subject to any disclaimer, the term of this patent is extended or adjusted under 35 U.S.C. 154(b) by 16 days.

(21) Appl. No.: 17/023,538

(22) Filed: Sep. 17, 2020

(65) Prior Publication Data
US 2021/0091025 A1 Mar. 25, 2021

(30) Foreign Application Priority Data
Sep. 20, 2019 (DE) .......................... 102019125447.7

(51) Int. Cl.
*H01L 23/00* (2006.01)
*C22C 21/10* (2006.01)
(Continued)

(52) U.S. Cl.
CPC .............. *H01L 24/05* (2013.01); *C22C 21/02* (2013.01); *C22C 21/10* (2013.01); *C22C 21/16* (2013.01);
(Continued)

(58) Field of Classification Search
CPC . H01L 24/05; H01L 24/03; H01L 2224/0345; H01L 2224/04042; H01L 2224/05118; H01L 2224/05123; H01L 2224/05124; H01L 2224/05139; H01L 2224/05147; H01L 2224/05149; H01L 2224/05163; H01L 2224/05166; H01L 2224/0517; H01L 2924/01012; H01L 2924/01013; H01L 2924/01014; H01L 2924/01021; H01L 2924/01022; H01L 2924/01025; H01L 2924/01029; H01L 2924/0103; H01L 2924/0104;
(Continued)

(56) References Cited

U.S. PATENT DOCUMENTS

| 5,824,234 A | 10/1998 | Jou et al. |
| 2002/0036355 A1 | 3/2002 | Young et al. |

(Continued)

FOREIGN PATENT DOCUMENTS

| CN | 109671821 A | * 4/2019 | ........... H01L 27/153 |
| CN | 104009158 B | * 6/2019 | ........... H01L 51/441 |

(Continued)

*Primary Examiner* — Douglas W Owens
(74) *Attorney, Agent, or Firm* — Murphy, Bilak & Hommiller, PLLC

(57) ABSTRACT

A semiconductor substrate has a bond pad. The bond pad includes a layer of an aluminum alloy having a chemical composition including at least 0.3% by weight of at least one of Zn, Mg, Sc, Zr, Ti, Ag and/or Mn, with the balance being at least Al and incidental impurities.

18 Claims, 2 Drawing Sheets

(51) Int. Cl.
*C22C 21/16* (2006.01)
*C22C 21/02* (2006.01)

(52) U.S. Cl.
CPC ...... *H01L 24/03* (2013.01); *H01L 2224/0345* (2013.01); *H01L 2224/04042* (2013.01); *H01L 2224/0517* (2013.01); *H01L 2224/05118* (2013.01); *H01L 2224/05123* (2013.01); *H01L 2224/05124* (2013.01); *H01L 2224/05139* (2013.01); *H01L 2224/05147* (2013.01); *H01L 2224/05149* (2013.01); *H01L 2224/05163* (2013.01); *H01L 2224/05166* (2013.01); *H01L 2924/0103* (2013.01); *H01L 2924/0104* (2013.01); *H01L 2924/01012* (2013.01); *H01L 2924/01013* (2013.01); *H01L 2924/01014* (2013.01); *H01L 2924/01021* (2013.01); *H01L 2924/01022* (2013.01); *H01L 2924/01025* (2013.01); *H01L 2924/01029* (2013.01); *H01L 2924/01047* (2013.01); *H01L 2924/3512* (2013.01)

(58) Field of Classification Search
CPC ........... H01L 2924/01047; C22C 21/02; C22C 21/10; C22C 21/16
See application file for complete search history.

(56) References Cited

U.S. PATENT DOCUMENTS

2011/0068349 A1* 3/2011 Shinohara ............... H01L 33/42
257/76
2011/0241204 A1  10/2011 Tanaka et al.
2020/0203566 A1* 6/2020 Lee .......................... H01L 33/42

FOREIGN PATENT DOCUMENTS

CN   109873011 A * 6/2019  ........... H01L 51/441
DE       3787772 T2   5/1994

\* cited by examiner

SEMICONDUCTOR SUBSTRATE HAVING A BOND PAD MATERIAL BASED ON ALUMINUM

TECHNICAL FIELD

This disclosure relates generally to the technique of manufacturing semiconductor substrates having bond pads, and in particular to a semiconductor substrates having a bond pad based on aluminum.

BACKGROUND

Wire bonding on aluminum (Al) bond pads has become a widely established process in semiconductor device manufacturing. Such Al bond pads are typically made of binary Al alloys AlCu, AlSi or ternary Al alloy AlSiCu rather than of pure Al. In particular, AlSiCu having a chemical composition in percent by weight consisting of 98.5% wt of Al, 1.0 wt % of Si and 0.5% wt of Cu, balance incidental impurities, is widely used in the art. This alloy has proven to combine good processability with high structural uniformity. Further, AlSiCu bond pads allow for low electrical contact resistance to the bond wire and effectively prevent electromigration.

Before the bond wires are attached to the bond pads, the wafers typically undergo a series of tests. During wafer testing, probing needles are used to contact the bond pads on the wafer. During probing, contact forces have to achieve sufficient values to ensure a low resistance and stable electrical contact to the bond pad. However, high contact forces cause a plastic deformation or indentation ("scrub depth") on the bond pad and may further provoke cracks in the oxide layer beneath the bond pad. Such bond pad deformation or cracks of the underlying layer could reduce the reliability of wire bonding during subsequent manufacturing and may cause yield losses during production or early failures in the field.

In some applications such as, e.g., for high power devices wafer probing needs to be repeated a number of times at different temperatures. This increases the risk of undue mechanical damage of the bond pads or the underlying layer. Briefly put, the integrity of bond pads and/or the bonding quality may be significantly affected by wafer testing.

SUMMARY

According to an aspect of the disclosure a semiconductor substrate has a bond pad. The bond pad comprises a layer of an aluminum alloy having a chemical composition comprising at least 0.3% by weight of at least one of Zn, Mg, Sc, Zr, Ti, Ag and/or Mn, optionally Cu and/or Si, the balance being Al and incidental impurities.

According to another aspect of the disclosure, a method of manufacturing a semiconductor substrate having a bond pad comprises providing the semiconductor substrate. The method further comprises depositing a bond pad material over the semiconductor substrate, the bond pad material comprising an aluminum alloy having a chemical composition comprising at least 0.3% by weight of at least one of Zn, Mg, Sc, Zr, Ti, Ag and/or Mn, optionally Cu and/or Si, the balance being Al and incidental impurities.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other and/or can be omitted if not described to be necessarily required. Embodiments are depicted in the drawings and are exemplarily detailed in the description which follows.

DETAILED DESCRIPTION

It is to be understood that the features of the various exemplary embodiments and examples described herein may be combined with each other, unless specifically noted otherwise.

Figure 1:
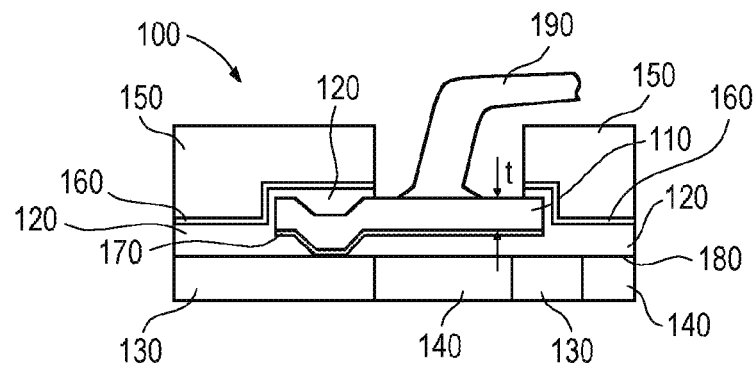
FIG. 1 is a cross-sectional view illustrating an example of a semiconductor substrate having a bond pad on which a bond wire is bonded.

Referring to FIG. 1, only a small portion of a semiconductor substrate 100 in the vicinity of a bond pad 110 is shown. For instance, the semiconductor substrate 100 may be a wafer or a chip. The bond pad 110 comprises a layer of an Al alloy material of a thickness t. The bond pad 110 may include one single layer of a particular Al alloy material (as depicted in FIG. 1) or may comprise further layers (not shown in FIG. 1) of different metal materials, e.g. of one or more of those Al alloy materials described in more detail further below.

An underlying layer 120 extends beneath the bond pad 110. The underlying layer 120 may, e.g., be an insulation layer such as, e.g., an inorganic layer which includes or consists of $SiO_2$ or any other inorganic insulating material. The underlying layer 120 may also be a bulk semiconductor material layer.

Further to the bond pad 110 and the underlying layer 120, the semiconductor substrate 100 may, e.g., include a wiring metal layer 130 embedded in an insulating layer 140 (e.g. of a low-k material). The wiring metal layer 130 and the insulating layer 140 may form a top metallization level of the semiconductor substrate 100.

Further, the semiconductor substrate 100 may, e.g., include one or more of a top resist layer 150 (e.g. an imide layer), a passivation layer 160 such as, e.g., a $Si_3N_4$ layer, a metallic liner layer 170 of, e.g., TaN and/or TiN disposed between the bond pad 110 and the wiring metal layer 130 as well as a barrier layer 180 of, e.g., $Si_3N_4$ separating the underlying layer 120 from the insulating layer 140. The semiconductor substrate 100 includes a semiconductor layer (not shown) beneath the bond pad 110 (and, e.g., beneath other layers shown in FIG. 1). Semiconductor devices such as, e.g., integrated circuits (ICs), transistors, etc., may be monolithically integrated in the semiconductor layer of the semiconductor substrate 100. The semiconductor devices may be electrically connected to the bond pad 110, e.g., via the metal layer 130.

An IC integrated in the semiconductor substrate 100 may be any kind of IC, e.g. a logic IC, memory IC, power IC such as, e.g., power transistor, power diode, or a power system-on-chip (SoC) such as, e.g., a power amplifier. The semiconductor layer of the semiconductor substrate 100 may comprise or be of a semiconductor material such as, e.g., Si, SiC, SiGe, GaAs, GaN, AlGaN, InGaAs, InAlAs, etc.

FIG. 1 further illustrates a bond wire 190 which is bonded to the bond pad 110. The bond wire 190 may, e.g., comprise or consist of Cu, Au, or Al. The bond wire 190 may be bonded to the bond pad 110 by heating the bond wire 190 and applying ultrasonic energy and pressure during the bonding (i.e. welding) process. The bond pad 110 as depicted in FIG. 1 has an idealized even and intact surface allowing for a low electrical contact resistance between the bond pad 110 and the bond wire 190.

Figures 2A, 2B:
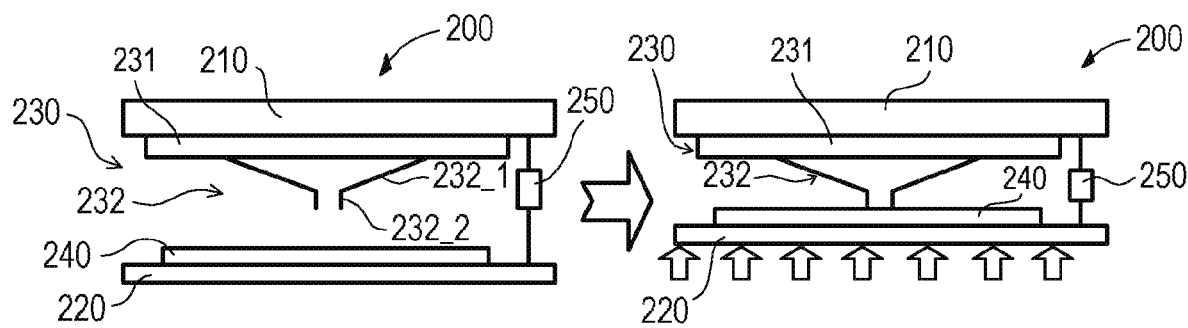
FIGS. 2A-2B are cross-sectional views illustrating an exemplary wafer test equipment for wafer probing before and after touch down of a probe card on a wafer.

FIG. 2A illustrates a cross-sectional view of an exemplary wafer test equipment 200 for wafer probing. The wafer test equipment 200 may include a holder 210, a wafer support (chuck) 220 and a manipulator 250 configured to vary the distance between the holder 210 and the wafer support 220. A probe card 230 may be attached to the holder 210. The probe card 230 may include a probing needle carrier 231 and a plurality of probing needles 232 fixed at the probing needle carrier 231. The probing needles 232 may be of a cantilever type having a cantilever section 232_1 and a tip section 232_2.

A wafer 240 may be placed on the wafer support 220. The wafer 240 may be the semiconductor substrate 100 or a precursor of the semiconductor substrate 100. For instance, the semiconductor substrate 100 may comprise a chip diced out of the wafer 240.

The wafer 240 may be produced by a specific semiconductor technology. A (specific) semiconductor technology may be defined, inter alia, by a particular bond pad material, a particular thickness of the bond pads, a particular design of the bond pads and a particular stack of layers beneath the bond pads.

FIG. 2B illustrates the wafer test equipment 200 during a touch-down of the probe card 230 on the wafer 240. During touch-down the tips 232_2 of the probing needles 232 get in contact with the bond pads 110 (see FIG. 1) on the wafer 240. The touch-down may be accomplished by the manipulator 250. The overdrive (i.e. the displacement from initial probing needle-bond pad contact to the setting position of the wafer test equipment 200) may be precisely measured and controlled. The overdrive corresponds to the force exerted by the tip of the probing needle 232 on the bond pad. The overdrive and the tip diameter are crucial parameters during wafer probing for the probability of the occurrence of bond pad damages.

Subsequent wire bonding may require sufficient residual bond pad thickness for reliable adhesion between the wire bond and the bond pad and/or to minimize the risk of bond pad cracking (which may lead to a failure of the integrated device). Therefore, the indentation depth (also referred to as "scrub depth") caused by a contact of the probing needle on the bond pad should not exceed a critical limit.

Exceeding such critical limit is considered as a first type of probing damage. Another type of probing damage is the occurrence of a crack in the underlying layer(s) of the bond pad. The occurrence of a crack may lead to a failure of the integrated device.

Figure 3:
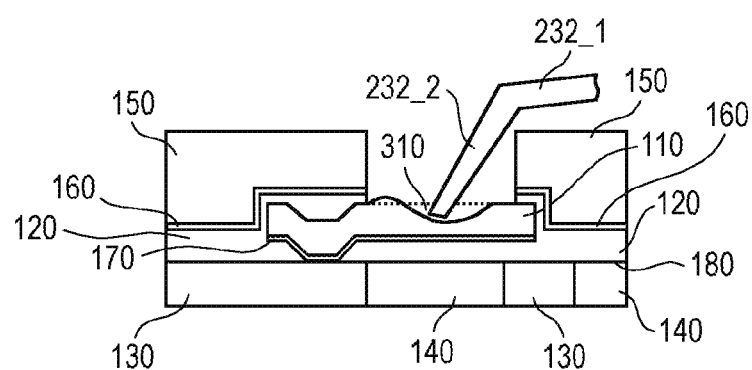
FIG. 3 is a cross-sectional view illustrating an exemplary indentation on a bond pad on a semiconductor substrate caused by a probing needle contacting the bond pad.

FIG. 3 illustrates the first type damage, i.e. the generation of a probe mark 310 on the bond pad 110 of a critical scrub depth. The scrub depth created by a probing needle touchdown on the bond pad depends, inter alia, on the force applied on the bond pad 110, on the geometry and diameter of the tip of the probing needle 232, and on the material of the bond pad 110.

Figure 4:
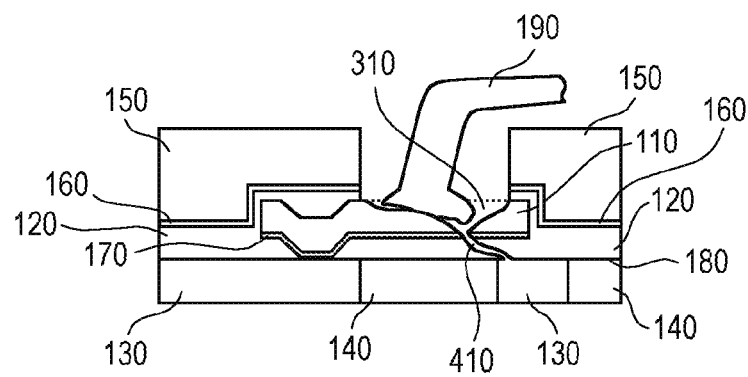
FIG. 4 is a cross-sectional view illustrating an exemplary crack in a layer underlying the bond pad caused either by the probing needle or by the wire bonding process.

FIG. 4 illustrates the second type damage, i.e. the generation of a crack 410 in the underlying layer(s) 120 of the bond pad 110. The crack probability depends, inter alia, on the force applied on the bond pad, on the geometry and diameter of the tip of the probing needle, on the material of the bond pad 110, on the thickness t of the bond pad 110 and on the material and thickness of the underlying layer(s) 120.

Further, mechanical and thermal loading as applied during the wire bonding process to the bond pad 110 may increase the risk of occurrence of a bond pad damage.

Both types of probing damage (and any damage which may be caused later by the wire bonding process) may be detrimental to the operability of a device in which the semiconductor substrate 100 is implemented. If the scrub depth exceeds a certain limit, the reliability of wire bonding on the bond pad 110 is significantly reduced. A crack 410 occurring in the underlying layer 120 may cause a breakdown of the integrated device. Both types of damage may cause yield losses or early device failures.

A probe card 230 may carry more than 10000, 15000 or even 20000 probing needles with variations in tip diameter which may be as great as >±20 or 25%. Therefore, a consistent scrub depth on the bond pads 110 and/or a consistent crack probability of the underlying layer(s) 120 cannot be realized. Hence, finding optimum probing parameters (overdrive, tip diameter) and an appropriate bond pad layer stack design (i.e. an appropriate semiconductor technology) for parts-per-million reliability is a challenge.

In the past, this problem has mostly been tackled by optimizing—and closely monitoring and readjusting during testing—the probing parameters (e.g. tip diameters, probe card forces/probe card overdrive) and/or by providing for a sufficient thickness t of the bond pads 110 and/or the underlying layer(s) 120.

The disclosure herein relies on an approach to consider the composition of the bond pad material to set mechanical properties of the bond pad 110 which are favourable in terms of reducing the probability of the occurrence of first and/or second type probing damages while still meeting the structural and electrical demands to ensure safe wire bonding.

More specifically, it was found that high tensile aluminum alloys as detailed below allow for a significant reduction of yield losses and/or early failures while still providing the requisite microstructural and electrical bond pad preconditions needed for wire bonding applications.

In the following an "alloy of X" (including further components Y, Z, . . . ) means that X is the base component of the alloy, i.e. the contribution of X in % wt (percent in weight) is greater than the contribution of Y in % wt and the contribution of Z in % wt, respectively. In particular, it may mean that the contribution of X is at least 50% wt, 80% wt or 90% wt.

The notation XY refers to an alloy of X including at least Y as a further component. In particular, it may refer to an alloy of X including Y as a sole residual component (i.e. a closed composition). In this case, the notation XY means that the alloy XY has a composition consisting of X (of the percent in weight of X) and Y (of the percent in weight of Y), the balance being only incidental impurities. The notation XYZ . . . likewise has the meaning of either an "open composition" or a "closed composition" with X, Y, Z, . . . forming the sole constituents of the alloy (except incidental impurities).

In general, an alloy XY . . . may refer to a binary, ternary, quaternary, quinary or senary alloy of X, with Y being the sole (binary alloy) or the main alloying element. Additional alloying components may, e.g., be Si, Mg, Zn, Cu, Fe, Ti, Mn, Li, Ag, Ni, and B.

The bond pad 110 is of or comprises a layer of an Al alloy having a chemical composition comprising a main alloying element selected from Zn, Mg, Cu, Si, and Sc. If the main alloying element is Cu, the chemical composition further comprises at least one element selected from Ti, Mg, Ag, and Zr. The bond pad 110 in embodiments has a thickness t of at least 1 µm.

In particular, the chemical composition may be represented by AlXY, wherein X is the main alloying element, Y is an optional inclusion of at least one element different from X and selected from Zr, Si, Mg, and Cu, if the main alloying element X is Zn, Mg, Si, or Sc, or Y is an inclusion of at least one element selected from Zr, Ti, Mg, and Ag if the main alloying element is Cu, and the balance being Al and incidental impurities.

By way of example, the Al alloy may, e.g., be AlZnMgCu, AlCuTiMgAg, AlCuZr, AlSc, AlMgZr, AlSiZr or AlMgSi. These Al alloys were found to be promising in view of their suitability to avoid probing damages and further in terms of their mechanical, electrical and microstructural properties.

The Al alloy AlZnMgCu may have the chemical composition in percent by weight comprising 5.1% wt≤Zn≤6.2% wt, 2.1% wt≤Mg≤2.9% wt, 1.2% wt≤Cu≤2.0% wt, balance Al and incidental impurities.

The Al alloy AlCuTiMgAg may have a chemical composition in percent by weight comprising 0.5% wt≤Cu≤8% wt, 0.3% wt≤Ti≤1.0% wt, 0.5% wt≤Mg≤1.0% wt, 0.5% wt≤Ag≤3% wt, balance Al and incidental impurities.

The Al alloy AlMgZr may have a chemical composition in percent by weight comprising 0.3% wt≤Mg≤5.0% wt, 0.3% wt≤Zr≤5.0% wt, balance Al and incidental impurities.

The Al alloy AlCuZr may have a chemical composition in percent by weight comprising 0.3% wt≤Cu≤5.0% wt, 0.3% wt≤Zr≤5.0% wt, balance Al and incidental impurities.

The Al alloy AlSc may have a chemical composition in percent by weight comprising 0.3% wt≤Sc≤5.0% wt, balance Al and incidental impurities.

The Al alloy AlSiZr may have a chemical composition in percent by weight comprising 0.3% wt≤Si≤5.0% wt, 0.3% wt≤Zr≤5.0% wt, balance Al and incidental impurities.

The Al alloy AlMgSi may have a chemical composition in percent by weight comprising 0.3% wt≤Mg≤5.0% wt, 0.3% wt≤Si≤5.0% wt, balance Al and incidental impurities.

Table 1 shows measurement results of mechanical properties of the bond pad 110, namely the Brinell hardness (in HB), the yield strength (in MPa) and the tensile strength (in MPa) of three reference materials, i.e. steel (ref_1), pure Al (99.5% wt of Al, ref_2), and AlCu4Mg1 (Dural, ref_3) together with two example Al alloy materials, i.e. AlZn5Mg2Cu1.5 (no_1: composition: 5.0% wt of Zn, 2.0% wt of Mg, 1.5% wt of Cu, balance Al and incidental impurities) and AlCu4Ti0.6Mg0.8Ag2 (no_2: composition: 4.0% wt of Cu, 0.6% wt of Ti, 0.8% wt of Mg, 2.0% wt of Ag, balance Al and incidental impurities).

As can be seen from table 1, the hardness of the example Al alloys no_1 and no_2 is about equal to or greater than the hardness of Dural (ref_3). The yield strength of the example Al alloys no_1 and no_2 is considerably higher than the yield strength of Dural. Further, the tensile strength of the aluminum alloys no_1 and no_2 is in the same range as the tensile strength of Dural (ref_3). Compared to unalloyed Al (ref_2) the mechanical properties of the example Al alloys no_1 and no_2 are significantly increased by alloying.

Without saying, the mechanical properties of steel (ref_1) are still higher than those of the example Al alloys no_1 and no_2.

TABLE 1

| Number | Material | Hardness (HB) | Yield Strength [MPa] | Tensile Strength [MPa] |
|---|---|---|---|---|
| ref_1 | Steel | 340-440 | 850-1050 | 1100-1250 |
| ref_2 | Al (99.5% wt) | 22-35 | 40 | 75 |
| ref_3 | AlCu4Mg1 (Dural) | 115-135 | 250 | 500-750 |
| no_1 | AlZn5Mg2Cu1.5 | 140 | 450 | 550 |
| no_2 | AlCu4Ti0.6Mg0.8Ag2 | 130-150 | 450 | 550 |

In case of Al alloys no_1 and no_2 the hardness was determined on the basis of homogeneous material compositions by mixing the alloy materials and fabricating a homogeneous material sample (sputter target) thereof like, for example, a cube.

Example Al alloy compositions for AlCuZr, AlSc, AlMgZr, AlSiZr and AlMgSi alloy materials are:
no_3: Cu=0.5% wt, Zr=0.5% wt, balance Al;
no_4: Sc=0.3% wt, balance Al;
no_5: Mg=3.0% wt, Zr=0.5% wt, balance Al;
no_6: Si=3.0% wt, Zr=0.5% wt, balance Al;
no_7: Mg=3.0% wt, Si=1.0% wt, balance Al.

The hardness of the example Al alloys no_3, no_4, no_5, and no_7 was measured on bond pads by nanoindentation measurements at 300 nm depth. The values for the hardness of the bond pads of Al alloys no_3 to no_5 and no_7 can be displayed as shown in Table 2 as a percentage in relation to a 100% reference point (ref_pad) which corresponds to the hardness value of an AlSiCu (more specifically the Al98.5Si1.0Cu0.5) alloy bond pad. All bond pads were produced by using the same process parameters in view of anneal temperature and anneal time). Hardness values for bond pads of Al alloy no_6 are not yet available, however an increase in hardness is suggested.

TABLE 2

| ref_pad | AlSiCu | 100.00% |
|---|---|---|
| no_3 | AlCuZr | 125.80% |
| no_4 | AlSc | 112.35% |
| no_5 | AlMgZr | 113.84% |
| no_7 | AlMgSi | 35.67% |

As to the preliminary measured low hardness value of example alloy no_7 (AlMgSi), it is believed that this alloy might nevertheless be a candidate for increased bond pad hardness once the process parameters (sputter process parameters, anneal temperature and anneal time) which control size and growth of crystal grains are optimized.

Since hardness is an approximate measure for the tensile strength, the tensile strength is similarly improved.

Figure 5:
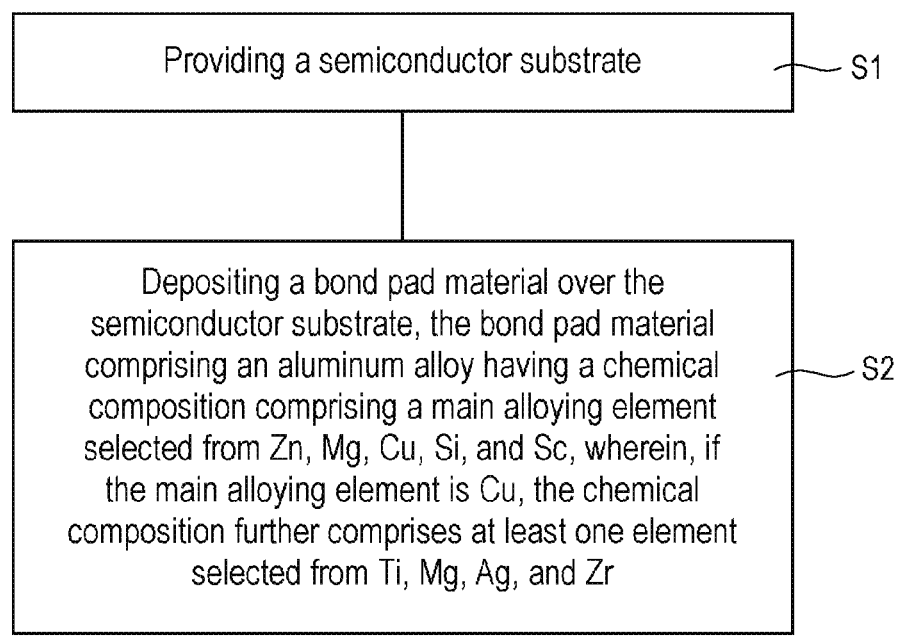
FIG. 5 is a flowchart depicting stages of a method of manufacturing a semiconductor substrate having a bond pad.

Referring to FIG. 5, a method of manufacturing a semiconductor substrate having a bond pad may include, at S1, providing the semiconductor substrate.

At S2 a bond pad material is deposited over the semiconductor substrate. The bond pad material may include an aluminum alloy having a chemical composition comprising a main allowing element selected from Zn, Mg, Cu, Si, and Sc wherein, if the main alloying element is Cu, the chemical composition further comprises at least one element selected from Ti, Mg, Ag, and Zr.

The depositing process may, e.g., be carried out by sputtering a target having the chemical composition of the bond pad to be fabricated. After the depositing process a conventional annealing process (e.g. similar to the annealing process as used for preparing conventional AlSi1Cu0.5 bond pads) may be carried out. Further, instead of sputtering, other deposition methods such as, e.g., gas phase deposition could be envisaged.

Further, the use of an aluminum alloy as referred to above for a bond pad on a semiconductor substrate is disclosed herein.

The following examples pertain to further aspects of the disclosure:

Example 1 is a semiconductor substrate having a bond pad, the bond pad comprising a layer of an aluminum alloy having a chemical composition comprising a main alloying element selected from Zn, Mg, Cu, Si, and Sc, wherein, if the main alloying element is Cu, the chemical composition further comprises at least one element selected from Ti, Mg, Ag, and Zr.

In Example 2, the subject matter of Example 1 can optionally include wherein the chemical composition is represented by AlXY, wherein X is the main alloying element, Y is an optional inclusion of at least one element different from X and selected from Zr, Si, Mg, or Cu, if the main alloying element is Zn, Mg, Si, or Sc, or Y is an inclusion of at least one element selected from Zr, Ti, Mg, and Ag if the main alloying element is Cu, and the balance being Al and incidental impurities.

In Example 3, the subject matter of Example 1 or 2 can optionally include wherein the aluminum alloy has a chemical composition of AlZnMgCu.

In Example 4, the subject matter of Example 3 can optionally include wherein the aluminum alloy has a chemical composition in percent by weight comprising 5.1% wt≤Zn≤6.2% wt, 2.1% wt≤Mg≤2.9% wt, 1.2% wt≤Cu≤2.0% wt, balance Al and incidental impurities.

In Example 5, the subject matter of Example 1 or 2 can optionally include wherein the aluminum alloy has a chemical composition of AlCuTiMgAg.

In Example 6, the subject matter of Example 5 can optionally include wherein the aluminum alloy has a chemical composition in percent by weight comprising 0.5% wt≤Cu≤8.0% wt, 0.3% wt≤Ti≤1.0% wt, 0.5% wt≤Mg≤1.0% wt, 0.5% wt≤Ag≤3.0% wt, balance Al and incidental impurities.

In Example 7, the subject matter of Example 1 or 2 can optionally include wherein the aluminum alloy has a chemical composition of AlCuZr.

In Example 8, the subject matter of Example 7 can optionally include wherein the aluminum alloy has a chemical composition in percent by weight comprising 0.3% wt≤Cu≤5.0% wt, 0.3% wt≤Zr≤5.0% wt, balance Al and incidental impurities.

In Example 9, the subject matter of Example 1 or 2 can optionally include wherein the aluminum alloy has a chemical composition of AlSc.

In Example 10, the subject matter of Example 9 can optionally include wherein the aluminum alloy has a chemical composition in percent by weight comprising 0.3% wt≤Sc≤5.0% wt, balance Al and incidental impurities.

In Example 11, the subject matter of Example 1 or 2 can optionally include wherein the aluminum alloy has a chemical composition of AlMgZr.

In Example 12, the subject matter of Example 10 can optionally include wherein the aluminum alloy has a chemical composition in percent by weight comprising 0.3% wt≤Mg≤5.0% wt, 0.3% wt≤Zr≤5.0% wt, balance Al and incidental impurities.

In Example 13, the subject matter of Example 1 or 2 can optionally include wherein the aluminum alloy has a chemical composition of AlSiZr.

In Example 14, the subject matter of Example 13 can optionally include wherein the aluminum alloy has a chemical composition in percent by weight comprising 0.3% wt≤Si≤5.0% wt, 0.3% wt≤Zr≤5.0% wt, balance Al and incidental impurities.

In Example 15, the subject matter of Example 1 or 2 can optionally include wherein the aluminum alloy has a chemical composition of AlMgSi.

In Example 16, the subject matter of Example 15 can optionally include wherein the aluminum alloy has a chemical composition in percent by weight comprising 0.3% wt≤Mg≤5.0% wt, 0.3% wt≤Si≤5.0% wt, balance Al and incidental impurities.

Example 17 is a method of manufacturing a semiconductor substrate having a bond pad, the method comprising: providing a semiconductor substrate; and depositing a bond pad material over the semiconductor substrate, the bond pad material comprising an aluminum alloy having a chemical composition comprising a main alloying element selected from Zn, Mg, Cu, Si, and Sc, wherein, if the main alloying element is Cu, the chemical composition further comprises at least one element selected from Ti, Mg, Ag, and Zr.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor substrate having a bond pad, the bond pad comprising a layer of an aluminum alloy, wherein the aluminum alloy comprises AlZnMgCu, AlCuTiMgAg, AlCuZr, AlSc, AlMgZr, AlSiZr or AlMgSi, with the balance being incidental impurities.

2. The semiconductor substrate of claim 1, wherein the bond pad has a thickness of at least 1 μm.

3. The semiconductor substrate of claim 1, wherein the aluminum alloy has a chemical composition of AlZnMgCu.

4. The semiconductor substrate of claim 3, wherein the aluminum alloy has a chemical composition in percent by weight comprising 5.1% wt≤Zn≤6.2% wt, 2.1% wt≤Mg≤2.9% wt, 1.2% wt≤Cu≤2.0% wt, with the balance being at least Al and incidental impurities.

5. The semiconductor substrate of claim 1, wherein the aluminum alloy has a chemical composition of AlCuTiMgAg.

6. The semiconductor substrate of claim 5, wherein the aluminum alloy has a chemical composition in percent by weight comprising 0.5%≤Cu≤8.0% wt, 0.3% wt≤Ti≤1.0% wt, 0.5% wt≤Mg≤1.0% wt, 0.5% wt≤Ag≤3.0% wt, with the balance being at least Al and incidental impurities.

7. The semiconductor substrate of claim 1, wherein the aluminum alloy has a chemical composition of AlCuZr.

8. The semiconductor substrate of claim 7, wherein the aluminum alloy has a chemical composition in percent by weight comprising 0.3% wt≤Cu≤5.0% wt, 0.3% wt≤Zr≤5.0% wt, with the balance being at least Al and incidental impurities.

9. The semiconductor substrate of claim 1, wherein the aluminum alloy has a chemical composition of AlSc.

10. The semiconductor substrate of claim 9, wherein the aluminum alloy has a chemical composition in percent by weight comprising 0.3% wt≤Sc≤5.0% wt, with the balance being at least Al and incidental impurities.

11. The semiconductor substrate of claim 1, wherein the aluminum alloy has a chemical composition of AlMgZr.

12. The semiconductor substrate of claim 11, wherein the aluminum alloy has a chemical composition in percent by weight comprising 0.3% wt≤Mg≤5.0% wt, 0.3% wt≤Zr≤5.0% wt, with the balance being at least Al and incidental impurities.

13. The semiconductor substrate of claim 1, wherein the aluminum alloy has a chemical composition of AlSiZr.

14. The semiconductor substrate of claim 13, wherein the aluminum alloy has a chemical composition in percent by weight comprising 0.3% wt≤Si≤5.0% wt, 0.3% wt≤Zr≤5.0% wt, with the balance being at least Al and incidental impurities.

15. The semiconductor substrate of claim 1, wherein the aluminum alloy has a chemical composition of AlMgSi.

16. The semiconductor substrate of claim 15, wherein the aluminum alloy has a chemical composition in percent by weight comprising 0.3% wt≤Mg≤5.0% wt, 0.3% wt≤Si≤5.0% wt, with the balance being at least Al and incidental impurities.

17. A method of manufacturing a semiconductor substrate having a bond pad, the method comprising:
provide a semiconductor substrate; and
depositing a bond pad material over the semiconductor substrate, the bond pad material comprising an aluminum alloy, wherein the aluminum alloy comprises AlZnMgCu, AlCuTiMgAg, AlCuZr, AlSc, AlMgZr, AlSiZr or AlMgSi, with the balance being incidental impurities.

18. The method of claim 17, wherein the chemical composition further comprises Cu and/or Si.

* * * * *